(12) United States Patent
Maeda

(10) Patent No.: US 6,898,058 B2
(45) Date of Patent: May 24, 2005

(54) COMPOSITE SUBSTRATE FOR USE IN MAGNETIC RECORDING-AND-REPRODUCING DEVICE

(75) Inventor: Michiharu Maeda, Fukui (JP)

(73) Assignee: Orion Electric Co., Ltd., Fukui (JP)

( * ) Notice: Subject to any disclaimer, the term of this patent is extended or adjusted under 35 U.S.C. 154(b) by 160 days.

(21) Appl. No.: 10/610,907

(22) Filed: Jul. 2, 2003

(65) Prior Publication Data

US 2004/0026108 A1 Feb. 12, 2004

(30) Foreign Application Priority Data

Jul. 8, 2002 (JP) ........................................ 2002-004184

(51) Int. Cl.⁷ .......................... G11B 15/00; G11B 17/02
(52) U.S. Cl. ...................... 360/137; 360/90; 360/97.01
(58) Field of Search ........................ 360/90, 93, 97.01, 360/137

(56) References Cited

U.S. PATENT DOCUMENTS

| | | | | | |
|---|---|---|---|---|---|
| 5,243,495 A | * | 9/1993 | Read et al. | ............... | 360/97.01 |
| 6,034,841 A | * | 3/2000 | Albrecht et al. | ......... | 360/97.01 |

* cited by examiner

*Primary Examiner*—Robert S. Tupper
(74) *Attorney, Agent, or Firm*—Wenderoth, Lind & Ponack, L.L.P.

(57) ABSTRACT

Disclosed is an improved composite substrate for use in a magnetic recording-and-reproducing device. It comprises an "L"-shaped main plate and a separate sub-plate. The "L"-shaped main plate has a major section of relatively large area and a minor section of relatively small area, integrally connected to one side of the major section. The sub-plate has a square or rectangular piece cut and separated from the minor section of the main plate. When being inversely arranged and jointed together two composite substrates can define a square or rectangular shape.

1 Claim, 4 Drawing Sheets

COMPOSITE SUBSTRATE FOR USE IN MAGNETIC RECORDING-AND-REPRODUCING DEVICE

BACKGROUND OF THE INVENTION

1. Field of the Invention

The present invention relates to a composite substrate for use in a magnetic recording-and-reproducing device, which composite substrate comprises a main plate and a separate sub-plate.

2. Related Art

Magnetic recording-and-reproducing devices and other electronics include printed circuit boards each having a lot of electronic parts to provide electric circuits. Small-sized electric circuits can be efficiently fabricated by installing a large number of electronic parts in a substrate at an increased density, and, advantageously such installation can be automatized.

As a general tendency different electronics have been reduced in size, and accordingly printed circuit boards used have been reduced in size. Downsizing of printed circuit boards meets the requirement for cost reduction, also.

Incidentally, a number of printed circuit boards are cut from a square or rectangular board material of stated size, that is, 1,000 mm by 1,000 mm or 1,000 mm by 1,200 mm.

It is, therefore, required that the number of substrates to be cut from a board material of stated size be so maximized as to make full use of the whole area of the stated size, leaving a minimum total of unused pieces.

FIG. 6 shows a cabinet 1 having a rectangular main plate 2 fitted therein. Likewise, an associated sub-plate 4 is rectangular in shape. These main plates and sub-plates can be cut from a square board material of stated size without allowing any useless pieces to remain for waste, provided that the longitudinal and lateral sizes each of the main and sub-plates are integer multiples of those of the board material. For example, the main plate 2 is 250 mm by 200 mm in respect of a square board material 1,000 mm by 1,000 mm.

As seen from FIG. 6, a deck 3 (broken lines) is laid at a level higher than the main plate 2, and therefore, relatively tall parts cannot be mounted on the main plate 2 except for the non-overlapping area in the main plate 2. Disadvantageously this limits the effective use of the main plate 2 to the non-overlapping area in respect of mounting tall parts.

FIG. 7 shows another conventional cabinet 1 having a relatively small main plate 2, which is so sized that a minimum remaining waste may be left when cutting main plates from the square board material, as for instance follows: the main plate is 250 mm by 166 mm, permitting 24 (=6×4) pieces to be cut from the original square. Such main plate 2 has a shortened vertical size, allowing the overlying deck 3 (broken lines) to extend beyond the lower horizontal side of the main plate 2. This necessitates that one corner of the cabinet 1 cut square to expose the terminals 6a and 6b from the terminal holes, which are made on the rear side of the cabinet 1. Such corner-cut cabinet, however, is less pleasing in appearance.

What is worse is to change the rear, floor and ceiling plates of the cabinet to be in conformity with the corner-cut shape. This requires new molding dies, which cost so much that the amount saved by reducing substrate size (and accordingly increasing the number of substrates to be cut from a single board material) cannot compensate for the amount involved for making such new molding dies.

In view of the above one object of the present invention is to provide a substrate which is so shaped that a possible minimum waste may be left in cutting a square or rectangular board material into as many separate substrates as possible, still allowing each substrate to have a substantial area available to installation of tall parts, standing upright apart from the overlying deck.

SUMMARY OF THE INVENTION

To attain this object a composite substrate for use in a magnetic recording-and-reproducing device is improved according to the present invention in that it comprises an "L"-shaped main plate and a separate square or rectangular sub-plate, said "L"-shaped main plate having a major section of relatively large area and a minor section of relatively small area, integrally connected to one side of the major section; and said sub-plate having a square or rectangular piece cut and separated from the minor section, whereby two composite substrates define a square or rectangular shape when being inversely arranged and jointed together.

The so shaped composite substrate permits full use of a square or rectangular board material of stated size, leaving little or no waste. Also, advantageously it has a substantial area available to installation of tall parts.

Other objects and advantages of the present invention will be understood from one preferred embodiment of the present invention, which is shown in accompanying drawings.

DETAILED DESCRIPTION OF PREFERRED EMBODIMENT

Figure 1:
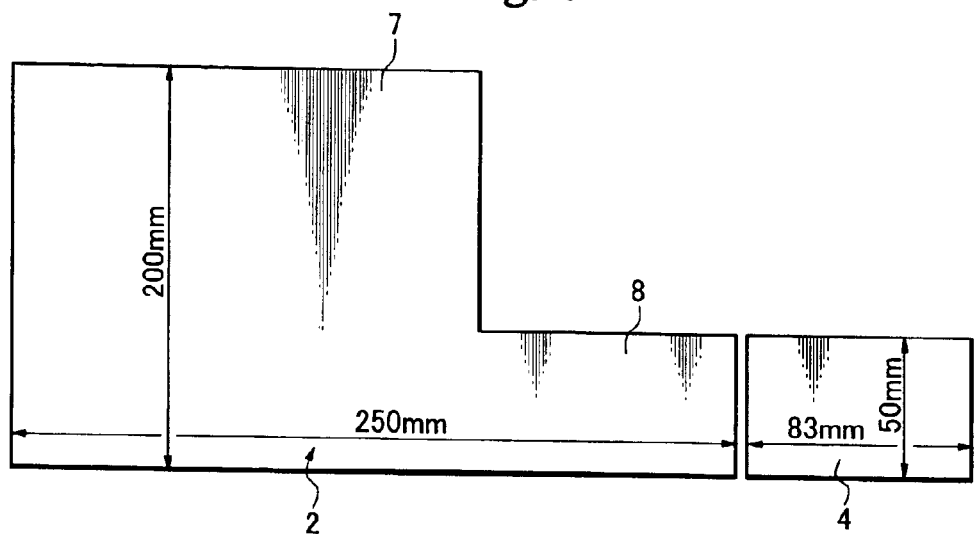
FIG. 1 is a plane view of an "L"-shaped main plate and a separate sub-plate, which together makes up a composite substrate according to the present invention.

FIG. 1 shows a composite substrate for use in a magnetic recording-and-reproducing device according to the present invention. It comprises an "L"-shaped main plate 2 and a separate sub-plate 4. The "L"-shaped main plate 2 comprises a major section 7 of relatively large area and a minor section 8 of relatively small area, integrally connected to one side of the major section 7. The sub-plate 4 comprises a square or rectangular piece, which is cut and separated from the minor section 8. Such composite substrates can be cut from a square or rectangular board of stated size (for examples, 1,000 mm×1,000 mm or 1,000 mm×1,200 mm). A plurality of pairs of composite substrates are so drawn in the square or rectangular board material of stated size that each pair of substrates may be inversely arranged and jointed together to define a square or rectangular shape (see FIG. 2), and the square or rectangular board material of stated size is punched, leaving little or no waste.

Figure 2:
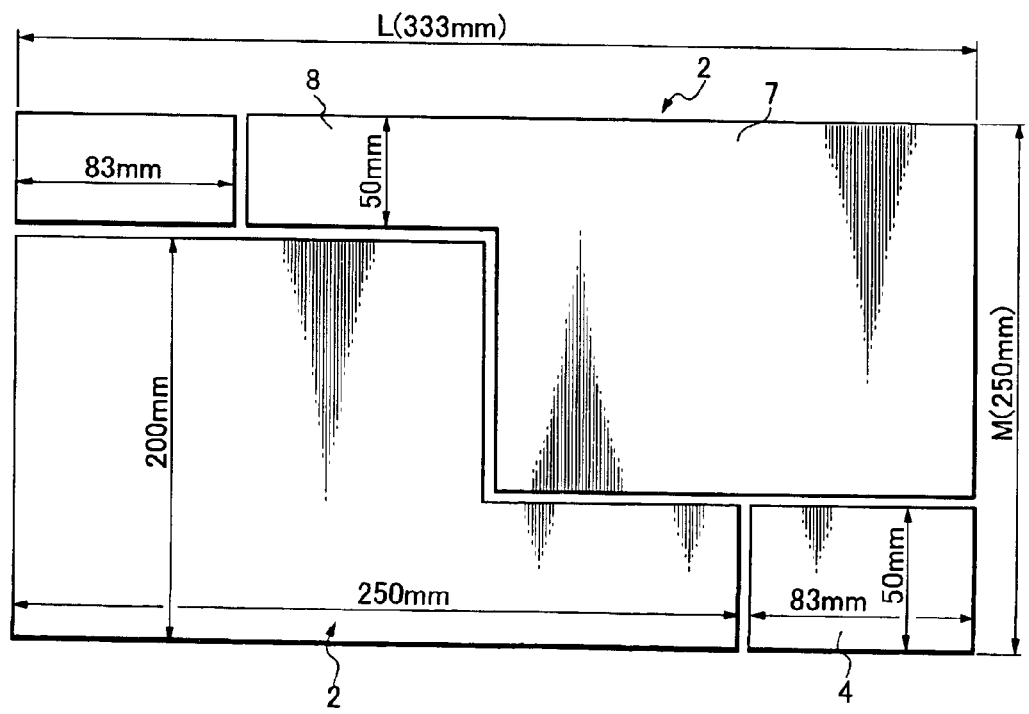
FIG. 2 is a plane view of two composite substrates inversely arranged and jointed together, thus defining a square or rectangular shape.

For example, the "L"-shaped main plate 2 is 200 mm by 250 mm, and the sub-plate 4 is 50 mm by 83 mm. Two composite substrates are combined as shown in FIG. 2 to define a blank area of 333 mm by 250 mm, thus permitting a square board of 1,000 mm times 1,000 mm to be punched leaving little waste (4 by 3 composite substrates for each square board material).

Figure 3:
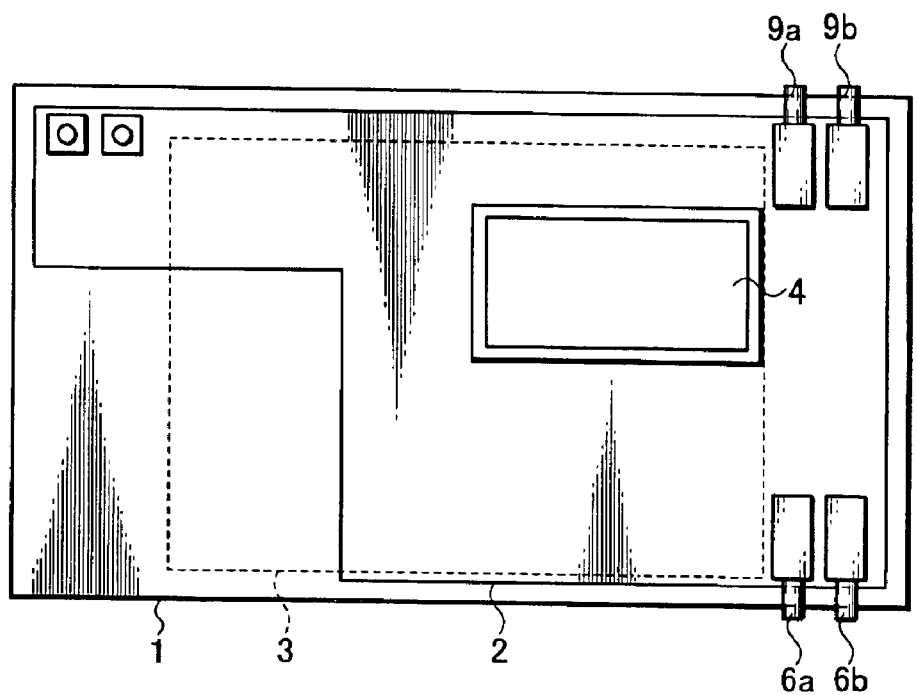
FIG. 3 is a plane view of a cabinet having the main plate and sub-plate arranged therein.
Figure 4:
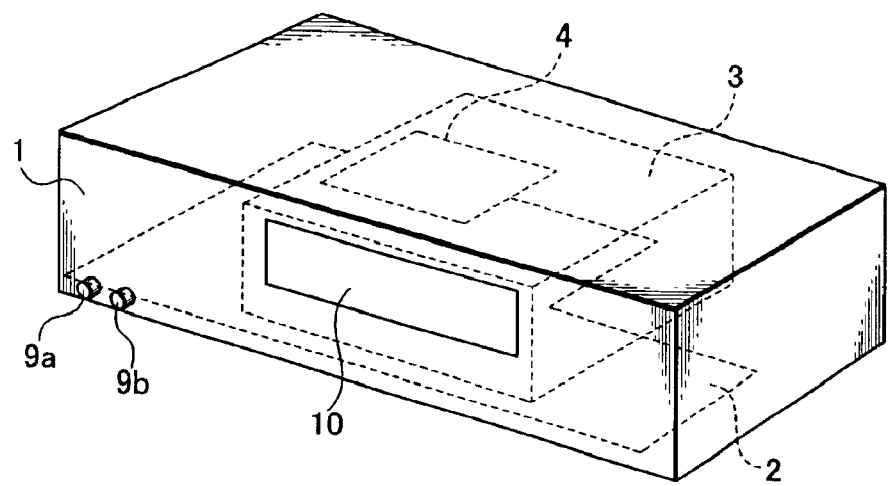
FIG. 4 is a perspective view of the cabinet of FIG. 3, the composite substrate of which has its main and sub-plates arranged at lower and higher levels respectively.

Referring to FIGS. 3 and 4, a cabinet 1 has a main plate 2 and an associated sub-plate 4 both laid under its overlying deck 3. As may be seen from these drawings, the main plate 2 has no area under one corner of the overlying deck 3. Thus, the area of the main plate 2 under the deck 3 (the overlapping area unavailable to installation of tall parts) is reduced. The main plate 2 has terminals 9a, 9b and 6a, 6b fixed to its front and rear sides. When the main plate 2 is fitted in the cabinet 1, the terminals 9a, 9b and 6a, 6b are positioned close to the front and rear sides of the cabinet 1, thereby permitting them to partly appear from the holes which are made in the front and rear sides of the cabinet 1. As seen from FIG. 4, the cabinet 1 has a tape cassette inlet 10 made on its front.

Figure 5:
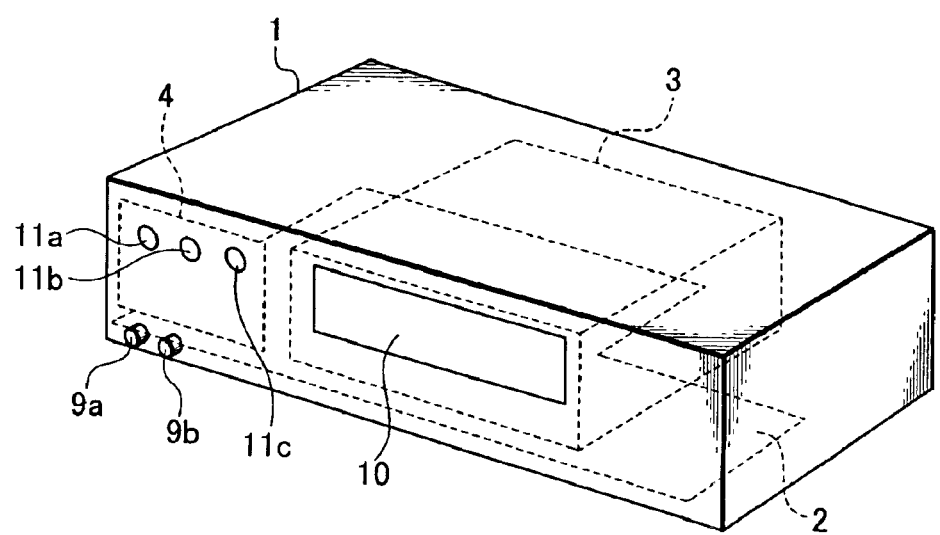
FIG. 5 is a perspective view of another cabinet, the composite substrate of which has its main and sub-plates arranged at the bottom and the front of the cabinet respectively.
Figure 6:
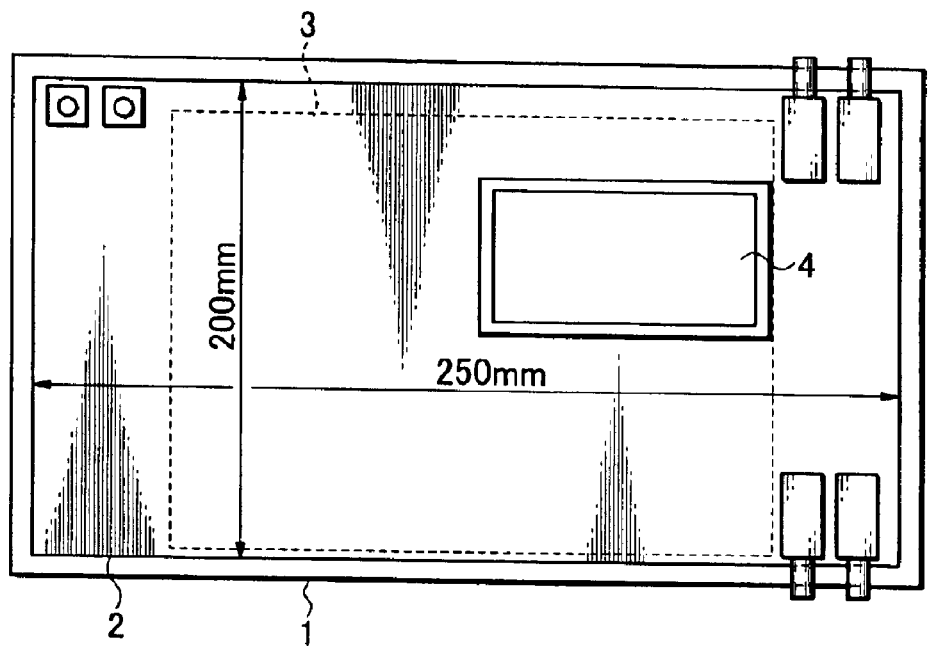
FIG. 6 is a plane view of a cabinet having a conventional composite substrate arranged therein.

FIG. 5 shows another cabinet 1 having a composite substrate 2, 4 arranged therein. It is different from FIG. 5 only in that a sub-plate 4 is arranged close to the front side. As shown, the sub-plate 4 has three switch units 11a, 11b and 11c mounted thereon.

As may be understood from the above, the particular L-shape of the main plate substantially reduces the under-the-deck area unavailable to installation of tall parts. An associated sub-plate can be provided by cutting the minor section of the main plate. Two composite substrates are inversely arranged and jointed together to define a square or rectangular shape. All of these make it possible to cut and separate a square or rectangular board material of stated size into as many composite substrates as possible, still assuring that the resultant substrate has a substantial area available to installation of tall parts, and that little or no waste remains.

Figure 7:
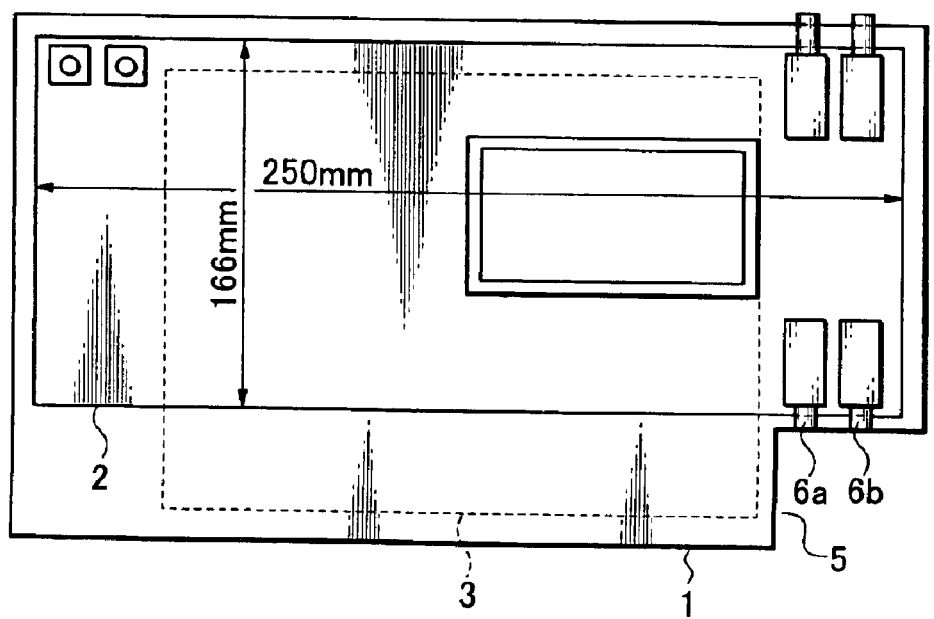
FIG. 7 is a plane view of a cabinet having another conventional composite substrate arranged therein.

Also advantageously, the major section of the main plate has its opposite sides close to the front and rear sides of the cabinet, thus permitting the terminals to partly appear from the terminal holes of the front and rear sides of the cabinet. No modification, therefore, is required in the square cabinet shape, which otherwise, would be modified or corner-cut to permit the terminals to partly appear from the terminal holes of the corner-cut of the cabinet (see FIG. 7).

In mounting electronic or electric parts on the main plates of substrates in line and in soldering them to printed circuits in DIP baths two main plates are paired, inversely arranged and jointed together to define a square or rectangular shape, and the paired main plates are made to advance step by step so that each main plate may be loaded with electronic or electric parts, and that they may be soldered to the printed circuit on each substrate. The loading and soldering can be effected on two main plates each step. Accordingly the loading-and-soldering efficiency can be doubled compared with the loading-and-soldering of one main plate at each step.

What is claimed is:

1. A composite substrate for use in a magnetic recording-and-reproducing device comprising an "L"-shaped main plate and a separate sub-plate, said "L"-shaped main plate having a major section of relatively large area and a minor section of relatively small area, integrally connected to one side of the major section; and said sub-plate having a square or rectangular piece cut and separated from the minor section of the main plate, whereby two composite substrates may define a square or rectangular shape when being inversely arranged and jointed together.

* * * * *